(12) United States Patent  
Zhang (10) Patent No.: US 10,116,312 B2
(45) Date of Patent: *Oct. 30, 2018

(54) CONFIGURABLE GATE ARRAY BASED ON THREE-DIMENSIONAL WRITABLE MEMORY

(71) Applicant: Guobiao Zhang, Corvallis, OR (US)

(72) Inventor: Guobiao Zhang, Corvallis, OR (US)

(73) Assignees: HangZhou HaiCun Information Technology Co., Ltd., HangZhou, ZheJiang (CN); Guobiao Zhang, Corvalis, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/784,077

(22) Filed: Oct. 13, 2017

(65) Prior Publication Data

US 2018/0041216 A1 Feb. 8, 2018

Related U.S. Application Data

(63) Continuation-in-part of application No. 15/450,049, filed on Mar. 6, 2017, now Pat. No. 9,838,021, which
(Continued)

(30) Foreign Application Priority Data

Mar. 5, 2016 (CN) .......................... 2016 1 0125227
May 10, 2016 (CN) .......................... 2016 1 0307102
(Continued)

(51) Int. Cl.
*G06F 7/38* (2006.01)
*H03K 19/177* (2006.01)
(Continued)

(52) U.S. Cl.
CPC .......... *H03K 19/1776* (2013.01); *G11C 5/02* (2013.01); *G11C 5/025* (2013.01);
(Continued)

(58) Field of Classification Search
None
See application file for complete search history.

(56) References Cited

U.S. PATENT DOCUMENTS 4,870,302 A 9/1989 Freeman
5,046,038 A 9/1991 Briggs et al.
(Continued)

OTHER PUBLICATIONS

Paul et al., "Reconfigurable Computing Using Content Addressable Memory for Improved Performance and Resource Usage", Design Automation Conference (DAC), pp. 786-791, 2008.
(Continued)

*Primary Examiner* — Anh Tran (57) ABSTRACT

The present invention discloses a configurable gate array based on three-dimensional writable memory (3D-W). It comprises an array of configurable computing elements, an array of configurable logic elements and an array of configurable interconnects. Each configurable computing element comprises at least a 3D-W array, which is electrically programmable and can be loaded with a look-up table (LUT) for a math function.

20 Claims, 7 Drawing Sheets

Related U.S. Application Data is a continuation-in-part of application No. 15/450,017, filed on Mar. 5, 2017, now Pat. No. 9,948,306.

(30) Foreign Application Priority Data

Mar. 3, 2017 (CN) .......................... 2017 1 0122749
Oct. 11, 2017 (CN) .......................... 2017 1 0942493

(51) Int. Cl.
*G11C 5/02* (2006.01)
*H03K 19/173* (2006.01)

(52) U.S. Cl.
CPC ... *H03K 19/1737* (2013.01); *H03K 19/17728* (2013.01); *H03K 19/17744* (2013.01)

(56) References Cited

U.S. PATENT DOCUMENTS

| | | |
|---|---|---|
| 5,835,396 A | 11/1998 | Zhang |
| 5,954,787 A | 9/1999 | Eun |
| 7,472,149 B2 | 12/2008 | Endo |
| 7,512,647 B2 | 3/2009 | Wilson et al. |
| 8,564,070 B2 | 10/2013 | Zhang |
| 9,207,910 B2 | 12/2015 | Azadet et al. |
| 9,225,501 B2 | 12/2015 | Azadet |
| 9,838,021 B2 * | 12/2017 | Zhang ................ H03K 19/1776 |

OTHER PUBLICATIONS

Karam et al, "Emerging Trends in Design and Applications of Memory-Based Computing and Content-Addressable Memories", Proceedings of the IEEE, vol. 103, issue 8, pp. 1311-1330, 2015.

* cited by examiner

CONFIGURABLE GATE ARRAY BASED ON THREE-DIMENSIONAL WRITABLE MEMORY

CROSS-REFERENCE TO RELATED APPLICATIONS

This application is a continuation-in-part of U.S. patent application Ser. No. 15/450,049, filed Mar. 6, 2017, which is a continuation-in-part of U.S. patent application Ser. No. 15/450,017, filed Mar. 5, 2017. These patent applications claim priorities from Chinese Patent Application No. 201610125227.8, filed Mar. 5, 2016; Chinese Patent Application No. 201610307102.7, filed May 10, 2016, in the State Intellectual Property Office of the People's Republic of China (CN).

This application also claims priorities from Chinese Patent Application No. 201710122749.7, filed Mar. 3, 2017; Chinese Patent Application No. 201710942493.4, filed Oct. 11, 2017, in the State Intellectual Property Office of the People's Republic of China (CN), the disclosure of which are incorporated herein by reference in their entireties.

BACKGROUND

1. Technical Field of the Invention

The present invention relates to the field of integrated circuit, and more particularly to configurable gate array.

2. Prior Art

A configurable gate array is a semi-custom integrated circuit designed to be configured by a customer after manufacturing. U.S. Pat. No. 4,870,302 issued to Freeman on Sep. 26, 1989 (hereinafter referred to as Freeman) discloses a configurable gate array. It contains an array of configurable logic elements (also known as configurable logic blocks) and a hierarchy of configurable interconnects (also known as programmable interconnects) that allow the configurable logic elements to be wired together. Each configurable logic element in the array is in itself capable of realizing any one of a plurality of logic functions (e.g. shift, logic NOT, logic AND, logic OR, logic NOR, logic NAND, logic XOR, arithmetic addition "+", arithmetic subtraction "−", etc.) depending upon a first configuration signal. Each configurable interconnect can selectively couple or de-couple interconnect lines depending upon a second configuration signal.

Complex math functions are widely used in various applications. To meet the speed requirements, many high-performance applications require that these complex math functions be implemented in hardware. In conventional configurable gate arrays, complex math functions are implemented in fixed computing elements, which are part of hard blocks and not configurable, i.e. the circuits implementing these complex math functions are fixedly connected and are not subject to change by programming. Apparently, fixed computing elements would limit further applications of the configurable gate array. To overcome this difficulty, the present invention expands the original concept of the configurable gate array by making the fixed computing elements configurable. In other words, besides configurable logic elements, the configurable gate array comprises configurable computing elements, which can realize any one of a plurality of math functions.

OBJECTS AND ADVANTAGES

It is a principle object of the present invention to extend the applications of a configurable gate array to the field of complex math computation.

It is a further object of the present invention to provide a configurable gate array where not only logic functions can be customized, but also math functions.

It is a further object of the present invention to provide a configurable gate array with more computing power.

It is a further object of the present invention to provide a configurable gate array with smaller die size and lower die cost.

In accordance with these and other objects of the present invention, the present invention discloses a configurable gate array based on three-dimensional writable memory (3D-W).

SUMMARY OF THE INVENTION

The present invention discloses a configurable gate array based on three-dimensional writable memory (3D-W). It comprises an array of configurable computing elements, an array of configurable logic elements and an array of configurable interconnects. Each configurable computing element comprises at least a 3D-W array, which is electrically programmable and can be loaded with a look-up table (LUT) for a math function. The usage cycle of the configurable computing element comprises two stages: a configuration stage and a computation stage. In the configuration stage, the LUT for a desired math function is loaded into the 3D-W array. In the computation stage, the functional value of the desired math function is read out from the LUT. For an electrically re-programmable 3D-W, a configurable computing element can be re-configured to realize different math functions.

Besides configurable computing elements, the preferred configurable gate array further comprises configurable logic elements and configurable interconnects. During operation, a complex math function is first decomposed into a number of basic math functions. Each basic math function is then realized by programming the associated configurable computing element. Finally, the complex math function is realized by programming the corresponding configurable logic elements and configurable interconnects. As used herein, basic math functions and complex math functions have relatively meaning. The basic math functions are used as building blocks for a complex math function. The basic math function could be a single-variable math function, e.g. a transcendental function; or, a multi-variable math function whose LUT with an acceptable precision can be stored into a 3D-W array.

Using 3D-W for configurable computing element offers many advantages. First of all, because it has a large storage density, 3D-W can be used to store a large LUT for a better math precision; or, more LUTs for more math functions. Being electrically programmable, the math functions that can be realized in a 3D-W array are essentially boundless. This is superior to the configurable gate array based on three-dimensional printed memory (3D-P), which supports a limited math library (referring to the co-pending U.S. patent application Ser. No. 15/450,017). Secondly, because they can be vertically stacked, the 3D-W arrays belonging to different configurable computing elements can be stacked together within a single 3D-W block. This would save substantial die area. Thirdly, because the 3D-W array does not occupy any substrate area, the configurable logic elements and/or the configurable interconnects can be formed underneath the 3D-W arrays. This would further save die area.

Accordingly, the present invention discloses a configurable gate array, comprising: at least a configurable logic element formed on a semiconductor substrate, wherein said configurable logic element selectively realizes a logic function from a logic library; at least a configurable computing element, wherein said configurable computing element comprises a first three-dimensional writable memory (3D-W) array stacked above said semiconductor substrate, said first 3D-W array is electrically programmable and can be loaded with a first look-up table (LUT) for a first math function.

The present invention further discloses another configurable gate array, comprising: at least a configurable interconnect formed on a semiconductor substrate, wherein said configurable interconnect selectively realizes an interconnect from an interconnect library; at least a configurable computing element, wherein said configurable computing element comprises a first three-dimensional writable memory (3D-W) array stacked above said semiconductor substrate, said first 3D-W array is electrically programmable and can be loaded with a first look-up table (LUT) for a first math function.

The present invention further discloses yet another configurable gate array, comprising: an array of configurable computing elements including a configurable computing element, wherein said configurable computing element is electrically programmable and can be loaded with a look-up table (LUT) for a math function; an array of configurable logic elements including a configurable logic element, wherein said configurable logic element selectively realizes a logic function from a logic library; an array of configurable interconnects including a configurable interconnect, wherein said array of configurable interconnects couple said array of configurable computing elements with said array of configurable logic elements; wherein said configurable gate array realizes a math function by programming said array of configurable computing elements, said array of configurable logic elements and said array of configurable interconnects.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments. In the present invention, the terms "program" and "configure" are used interchangeably.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 1:
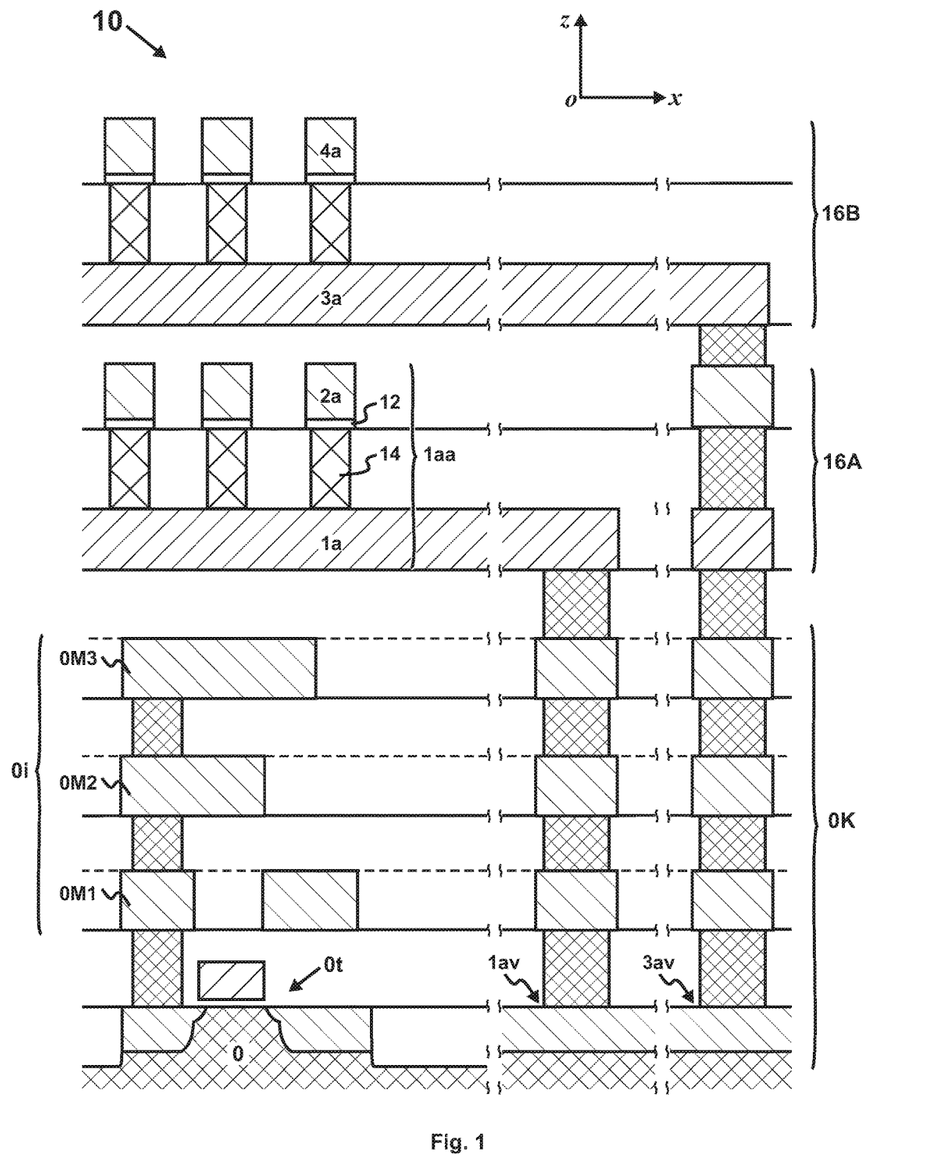
FIG. 1 is a cross-sectional view of a three-dimensional writable memory (3D-W)

Referring now to FIG. 1, a preferred three-dimensional writable memory (3D-W) 10 is shown. 3D-W is a type of three-dimensional memory (3D-M) whose memory cells are electrically programmable. Based on the number of programming allowed, a 3D-W can be categorized into three-dimensional one-time-programmable memory (3D-OTP) and three-dimensional multiple-time-programmable memory (3D-MTP). Types of the 3D-MTP cell include flash-memory cell, memristor, resistive random-access memory (RRAM or ReRAM) cell, phase-change memory (PCM) cell, programmable metallization cell (PMC), conductive-bridging random-access memory (CBRAM) cell, and the like.

Based on the orientation of the memory cells, the 3D-W can be categorized into horizontal 3D-W (3D-$W_H$) and vertical 3D-W (3D-$W_V$). In a 3D-$W_H$, all address lines are horizontal and the memory cells form a plurality of horizontal memory level(s). A well-known 3D-$W_H$ is 3D-XPoint. In a 3D-$W_V$, at least one set of the address lines are vertical and the memory cells form a plurality of vertical memory strings. A well-known 3D-$W_V$ is 3D-NAND. In general, the 3D-$W_H$ (e.g. 3D-XPoint) is faster, while the 3D-$W_V$ (e.g. 3D-NAND) is denser.

The 3D-W 10 comprises a substrate circuit 0K formed on the substrate 0. A first memory level 16A is stacked above the substrate circuit 0K, with a second memory level 16B stacked above the first memory level 16A. The substrate circuit 0K includes the peripheral circuits of the memory levels 16A, 16B. It comprises transistors 0t and the associated interconnect 0i (including 0M1-0M3). Each of the memory levels (e.g. 16A, 16B) comprises a plurality of first address-lines (i.e. y-lines, e.g. 2a, 4a), a plurality of second address-lines (i.e. x-lines, e.g. 1a, 3a) and a plurality of 3D-W cells (e.g. 1aa, 2aa). The first and second memory levels 16A, 16B are coupled to the substrate circuit 0K through contact vias 1av, 3av, respectively.

In a 3D-W, each memory level comprises at least a 3D-W array. A 3D-W array is a collection of 3D-W cells in a memory level that share at least one address-line. Within a single 3D-W array, all address-lines are continuous; between adjacent 3D-W arrays, address-lines are not continuous. On the other hand, a 3D-W die comprises a plurality of 3D-W blocks. Each 3D-W block includes all memory levels in a 3D-W and its topmost memory level only comprises a single 3D-W array, whose projection on the substrate defines the boundary of the 3D-W block.

In this preferred embodiment, the 3D-W cell 1aa comprises a programmable layer 12 and a diode layer 14. The programmable layer 12 could be an OTP layer (e.g. an antifuse layer, used for the 3D-OTP) or an MTP layer (e.g. a phase-change layer, used for the 3D-MTP. The diode layer 14 is broadly interpreted as any layer whose resistance at the read voltage is substantially lower than the case when the applied voltage has a magnitude smaller than or polarity opposite to that of the read voltage. The diode could be a semiconductor diode (e.g. p-i-n silicon diode), or a metal-oxide (e.g. $TiO_2$) diode.

Figure 2:
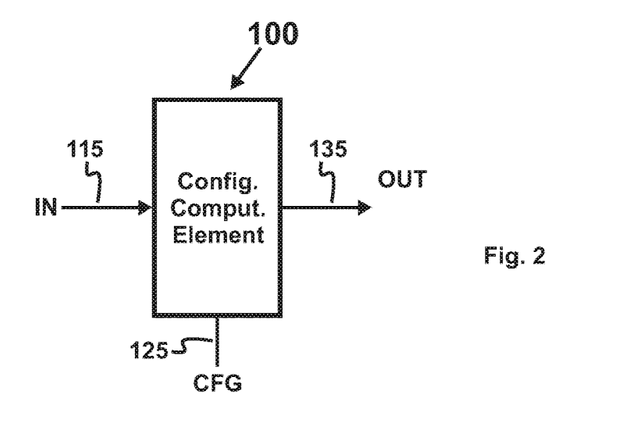
FIG. 2 discloses a symbol for a preferred configurable computing element.

Referring now to FIG. 2, a symbol for a preferred configurable computing element 100 is shown. The input port IN includes input data 115, the output port OUT includes output data 135, and the configuration port CFG includes at least a configuration signal 125. When the configuration signal 125 is "write", the LUT for a desired math function is loaded into the configurable computing element 100; when the configuration signal 125 is "read", the functional value of the desired math function is read out from the LUT.

Figure 3:
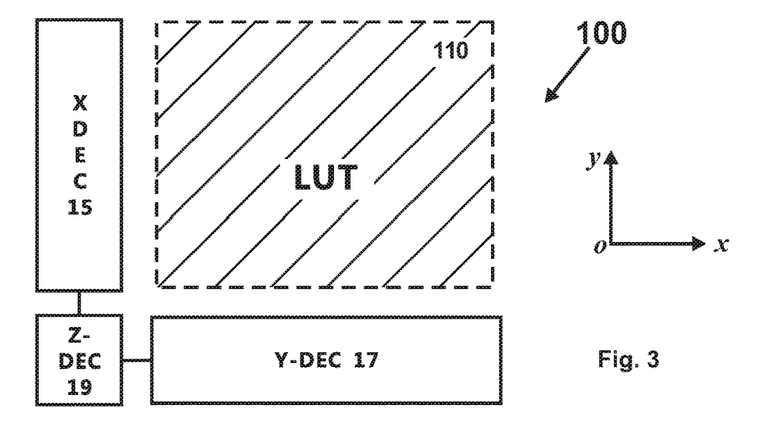
FIG. 3 is a substrate layout view of a preferred configurable computing element.

FIG. 3 discloses a preferred configurable computing element 100. This figure is a layout view of its substrate circuit 0K. Because the 3D-W arrays are stacked above the substrate 0K and not located in the substrate 0, their projections on the substrate 0, not the 3D-W arrays themselves, are shown in the areas enclosed by dash lines. In this preferred embodiment, the LUT is stored in at least a 3D-W array 110. The substrate circuit 0K includes the X decoder 15, Y decoder (including read-out circuit) 17 and Z decoder 19 for the 3D-W array 110.

Figure 4:
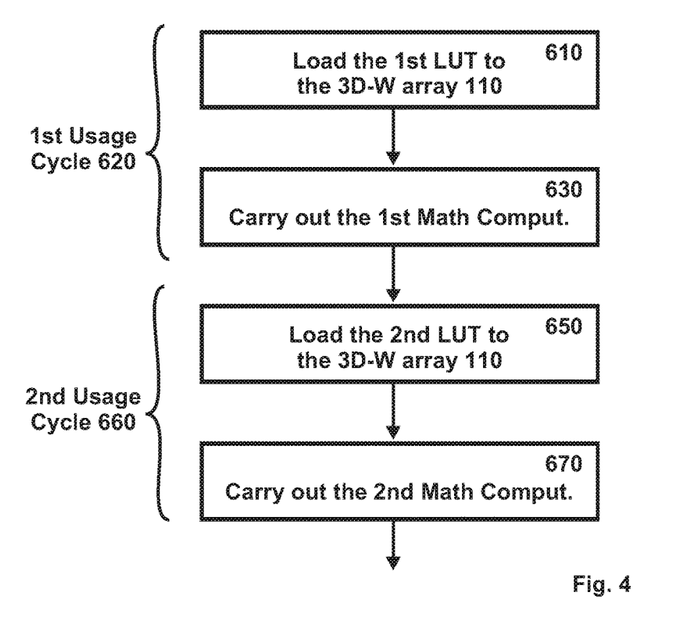
FIG. 4 discloses two usage cycles of a preferred re-configurable computing element.

Referring now to FIG. 4, two usage cycles 620, 660 of a preferred re-configurable computing element 100 are shown. For the re-configurable computing element 100, the 3D-W array 110 is electrically re-programmable. The first usage cycle 620 comprises two stages: a configuration stage 610 and a computation stage 630. In the configuration stage 610, the LUT of a first desired math function is loaded into the 3D-W array 110. In the computation stage 630, the functional value of the first desired math function is read out from the LUT. Being electrically re-programmable, the re-configurable computing element 100 can realize different math functions during different usage cycles 620, 660. During the second usage cycle 660 (including two stages 650, 670), a second desired math function is loaded and then read out. The re-configurable computing element 100 is particularly suitable for single-instruction-multiple-data (SIMD)-type of data processing. Once the LUTs are loaded into the 3D-W arrays 110 in the configuration stage, a large amount of data can be fed into the re-configurable computing element 100 and processed in high speed. SIMD has many applications, e.g. vector processing in image processing, massively parallel processing in scientific computing.

Figure 5A:
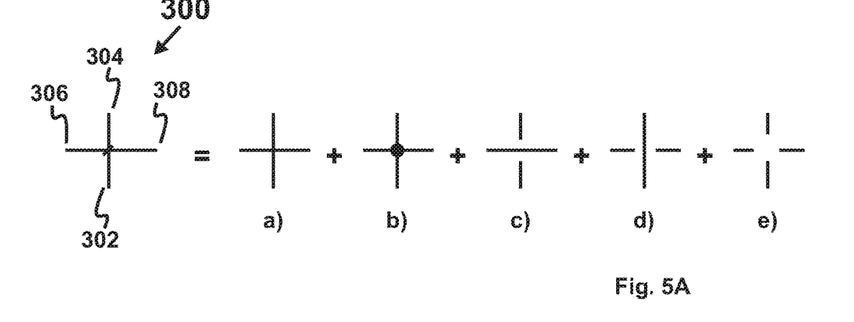
FIG. 5A shows an interconnect library supported by a preferred configurable interconnect.
Figure 5B:
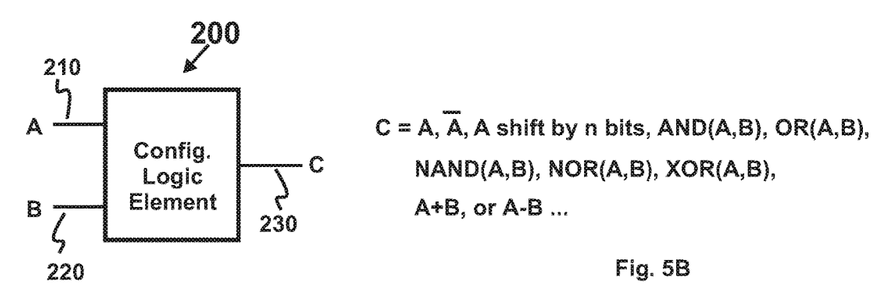
FIG. 5B shows a logic library supported by a preferred configurable logic element.

Referring now to FIGS. 5A-5B, an interconnect library and a logic library are shown. FIG. 5A shows the interconnect library supported by a preferred configurable interconnect 300. An interconnect library is a collection of all interconnects supported by a configurable interconnect. This interconnect library includes the followings: a) the interconnects 302/304 are coupled, the interconnects 306/308 are coupled, but 302/304 are not connected with 306/308; b) the interconnects 302/304/306/308 are all coupled; c) the interconnects 306/308 are coupled, but the interconnects 302, 304 are not coupled, neither are 302, 304 connected with 306/308; d) the interconnects 302/304 are coupled, but the interconnects 306, 308 are not coupled, neither are 306, 308 connected with 302/304; e) interconnects 302, 304, 306, 308 are not coupled at all. As used herein, the symbol "/" between two interconnects means that these two interconnects are coupled, while the symbol "," between two interconnects means that these two interconnects are not coupled. More details on the configurable interconnects are disclosed in Freeman.

FIG. 5B shows the logic library supported by a preferred configurable logic element 200. A logic library is a collection of all logic functions supported by a configurable logic element. In this preferred embodiment, the inputs A and B are input data 210, 200, and the output C is the output data 230, the logic library includes the followings: C=A, NOT A, A shift by n bits, AND(A,B), OR(A,B), NAND(A,B), NOR(A,B), XOR(A,B), A+B, A−B. To facilitate pipelining, the configurable logic element 200 may comprise sequential logic such as flip-flops and registers. More details on the configurable logic elements are disclosed in Freeman.

Figure 6:
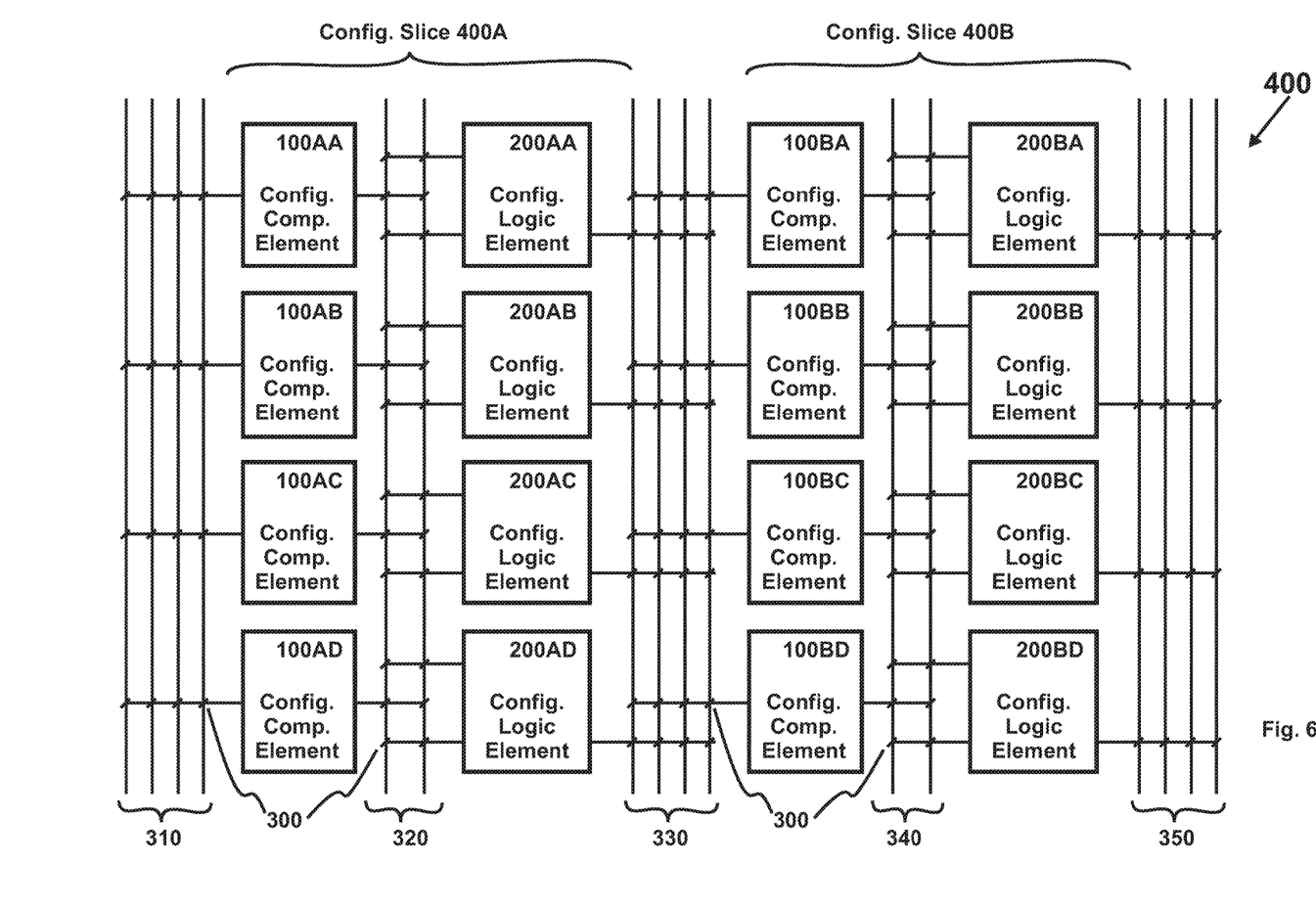
FIG. 6 is a circuit block diagram of a first preferred configurable gate array.

Referring now to FIG. 6, a first preferred configurable gate array 400 is disclosed. It comprises first and second configurable slices 400A, 400B. Each configurable slice (e.g. 400A) comprises a first array of configurable computing elements (e.g. 100AA-100AD) and a second array of configurable logic elements (e.g. 200AA-200AD). A configurable channel 320 is placed between the first array of configurable computing elements (e.g. 100AA-100AD) and the second array of configurable logic elements (e.g. 200AA-200AD). The configurable channels 310, 330, 350 are also placed between different configurable slices 300A, 300B. The configurable channels 310-350 comprise an array of configurable interconnects 300. For those skilled in the art, besides configurable channels, sea-of-gates may also be used.

Figure 7:
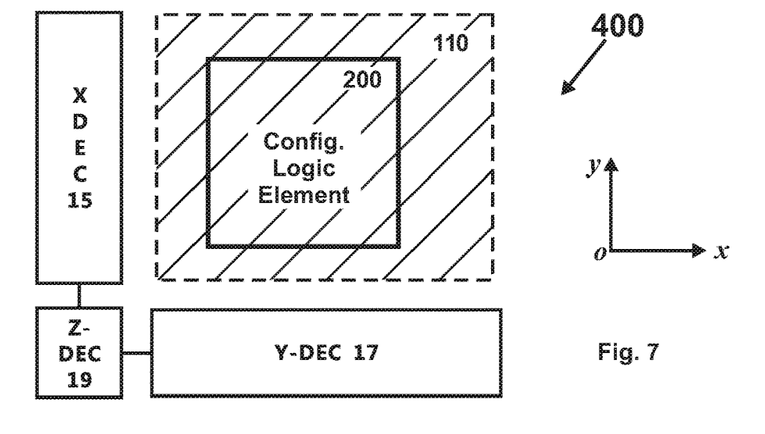
FIG. 7 is a substrate layout view of a first implementation of the first preferred configurable gate array.

FIG. 7 shows a first implementation of the first preferred configurable gate array 400 is shown. Because it does not occupy any substrate area, the 3D-W array 110 can be stacked above the configurable logic element 200 and at least partially cover the configurable logic element 200. Similarly, the 3D-W array 110 can be stacked above the configurable interconnect 300 and at least partially cover the configurable interconnect 300. Apparently, this would save die area.

Figure 8A:
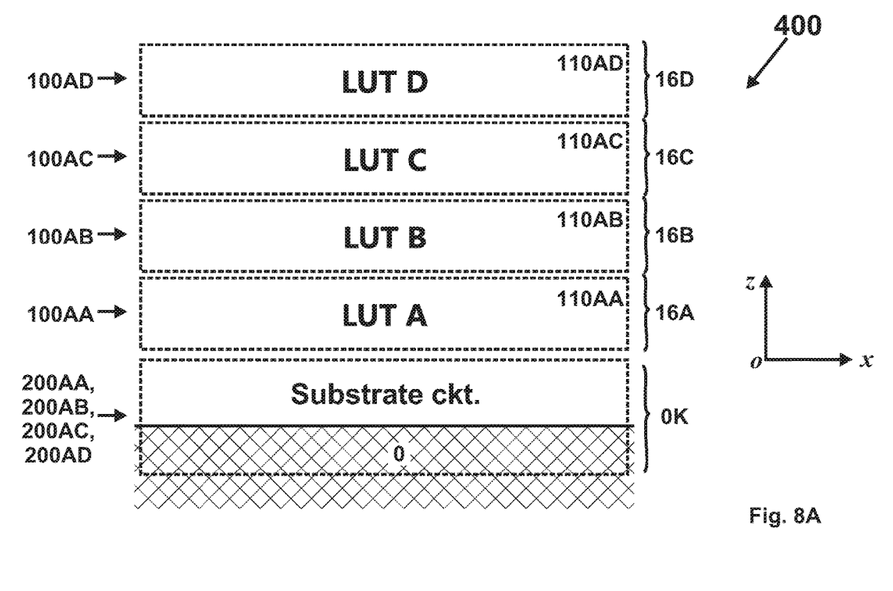
FIG. 8A is a cross-sectional view of a second implementation of the first preferred configurable gate array.
Figure 8B:
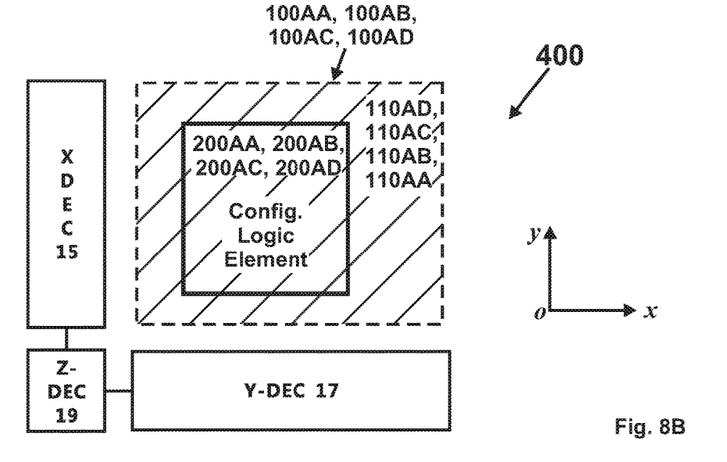
FIG. 8B is its substrate layout view.

FIGS. 8A-8B show a second implementation of the first preferred configurable gate array 400. This implementation corresponds to the configurable slice 400A of FIG. 6. For the configurable computing elements 100AA-100AD, their 3D-W arrays 110AA-110AD can be vertically stacked in a single 3D-W block. To be more specific, the substrate circuit 0K comprises the configurable logic elements 200AA-200AD; the 3D-W array 110AA for the configurable computing element 100AA (storing the LUT A for a first math function) is placed in the first memory level 16A and stacked above the substrate 0K (along the +Z direction), the 3D-W array 110AB for the configurable computing element 100AB (storing the LUT B for a second math function) is placed in the second memory level 16B and stacked above the 3D-W array 110AA (along the +Z direction), the 3D-W array 110AC for the configurable computing element 100AC (storing the LUT C for a third math function) is placed in the third memory level 16C and stacked above the 3D-W array 110AB (along the +Z direction), and the 3D-W array 110AD for the configurable computing element 100AD (storing the LUT D for a fourth math function) is placed in the fourth memory level 16D and stacked above the 3D-W array 110AC (along the +Z direction). This arrangement becomes more apparent in the substrate layout view of FIG. 8B. The projections of the 3D-W arrays 110AA-110AD (storing the LUTs A-D) overlap each other on the substrate 0. This would save substantial die area and lead to a compact configurable gate array 400.

Figure 9:
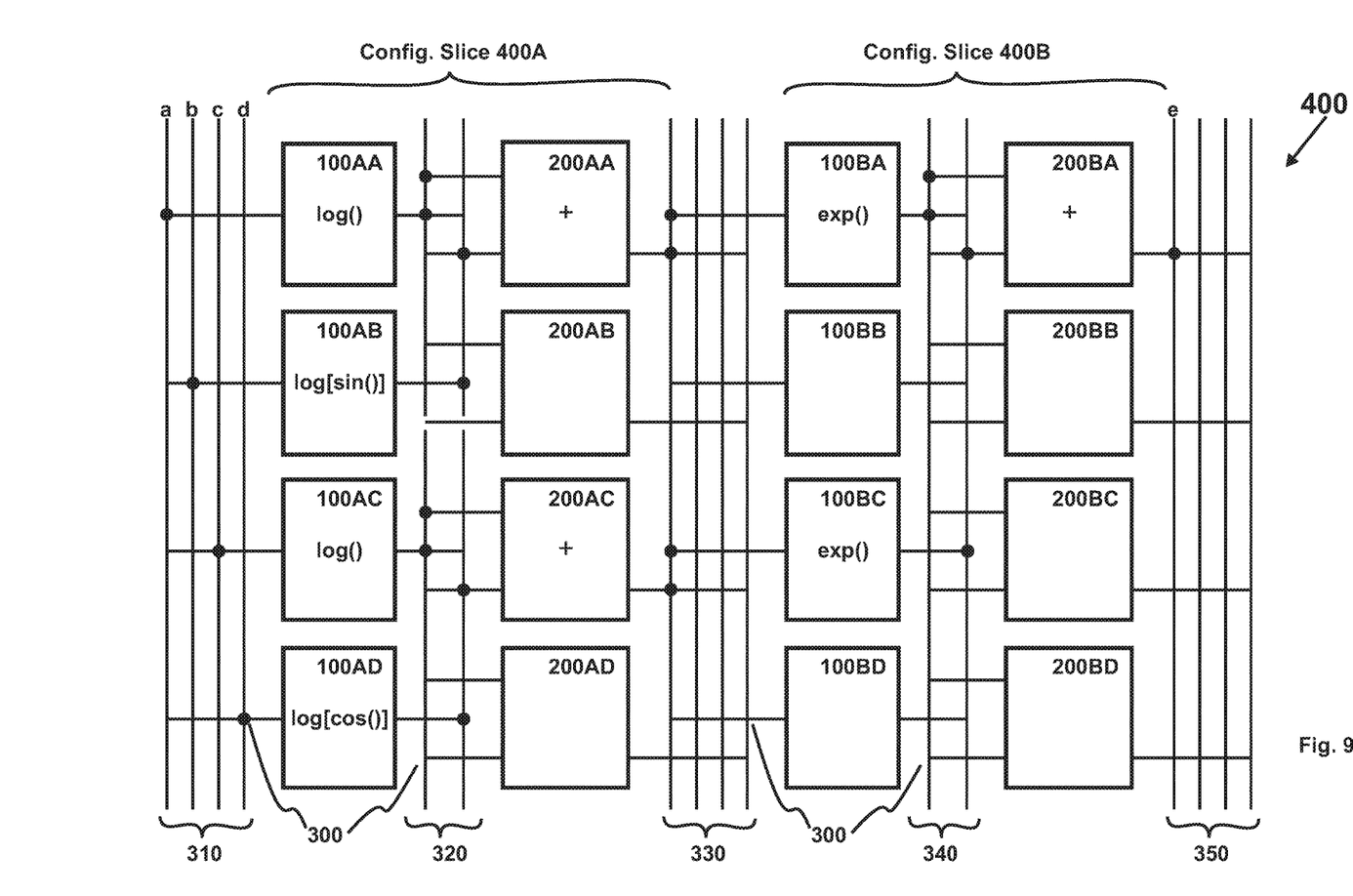
FIG. 9 shows an instantiation of the first preferred configurable gate array implementing a complex math function.

FIG. 9 discloses an instantiation of the first preferred configurable gate array implementing a complex math function e=a·sin(b)+c·cos(d). The configurable interconnects 300 in the configurable channel 310-350 use the same convention as FIG. 5A: the interconnects with dots at the intersection mean that the interconnects are connected; the interconnects without dots at the intersection mean that the interconnects are not connected; a broken interconnect means that two broken sections are two un-coupled interconnect lines. In this preferred implementation, the configurable computing element 100AA is configured to realize the function log( ) whose result log(a) is sent to a first input of the configurable logic element 200A. The configurable computing element 100AB is configured to realize the function log [sin( )], whose result log [sin(b)] is sent to a second input of the configurable logic element 200A. The configurable logic element 200A is configured to realize arithmetic addition, whose result log(a)+log [sin(b)] is sent the configurable computing element 100BA. The configurable computing element 100BA is configured to realize the function exp( ) whose result exp{log(a)+log [sin(b)]}=a·sin(b) is sent to a first input of the configurable logic element 200BA. Similarly, through proper configurations, the results of the configurable computing elements 100AC, 100AD, the configurable logic elements 200AC, and the configurable computing element 100BC can be sent to a second input of the configurable logic element 200BA. The configurable logic element 200BA is configured to realize arithmetic addition, whose result a·sin(b)+c·cos(d) is sent to the output e. Apparently, by changing its configuration, the configurable gate array 400 can realize other complex math functions.

Figure 10:
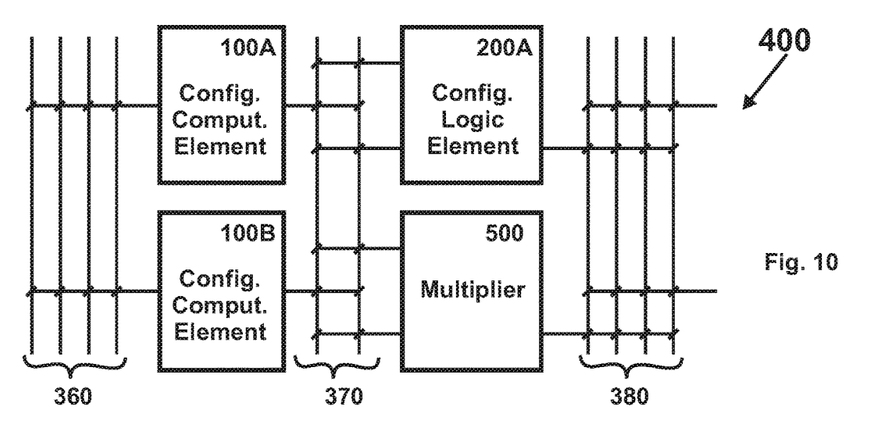
FIG. 10 is a circuit block diagram of a second preferred configurable gate array.

Referring now to FIG. 10, a second preferred configurable gate array 400 is shown. Besides configurable computing elements 100A, 100B and configurable logic element 200A, this preferred embodiment further comprises a multiplier 500. The configurable channels 360-380 comprise a plurality of configurable interconnects. With the addition of the multiplier 500, the preferred configurable gate array 400 can realize more math functions and its computational power will become more powerful.

Figure 11A:
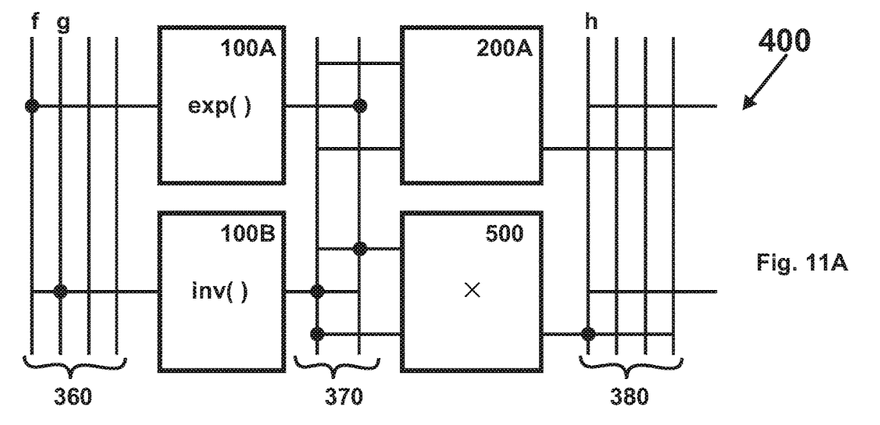
FIGS. 11A-11B show two instantiations of the second preferred configurable gate array.
Figure 11B:
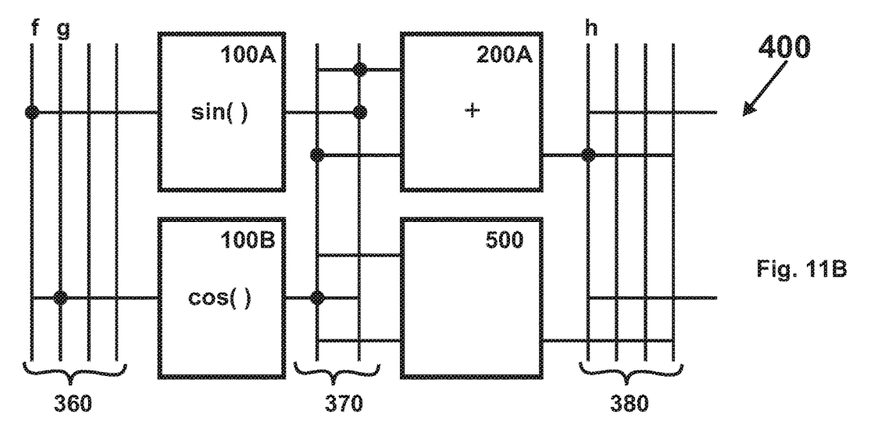

FIGS. 11A-11B disclose two instantiations of the second preferred configurable gate array 400. In the instantiation of FIG. 11A, the configurable computing element 100A is configured to realize the function exp(f), while the configurable computing element 100B is configured to realize the function inv(g). The configurable channel 370 is configured in such a way that the outputs of 100A, 100B are fed into the multiplier 500. The final output is then h=exp(f)*inv(g). On the other hand, in the instantiation of FIG. 11B, the configurable computing element 100A is configured to realize the function sin(f), while the configurable computing element 100B is configured to realize the function cos(g). The configurable channel 370 is configured in such a way that the outputs of 100A, 100B are fed into the configurable logic element 200A, which is configured to realize arithmetic addition. The final output is then h=sin(f)+cos(g).

While illustrative embodiments have been shown and described, it would be apparent to those skilled in the art that many more modifications than that have been mentioned above are possible without departing from the inventive concepts set forth therein. The invention, therefore, is not to be limited except in the spirit of the appended claims.

What is claimed is:

1. A configurable gate array, comprising:
    at least a configurable logic element formed on a semiconductor substrate, wherein said configurable logic element selectively realizes a logic function from a logic library; and
    at least a configurable computing element, wherein said configurable computing element comprises a first three-dimensional writable memory (3D-W) array stacked above said semiconductor substrate, said first 3D-W array is electrically programmable and can be loaded with a first look-up table (LUT) for a first math function.

2. The configurable gate array according to claim 1, wherein said first 3D-W array at least partially covers said configurable logic element.

3. The configurable gate array according to claim 1, further comprising at least a configurable interconnect.

4. The configurable gate array according to claim 1, wherein said 3D-W array is a horizontal 3D-W array or a vertical 3D-W array.

5. The configurable gate array according to claim 1, further comprising at least a second 3D-W array stacked above said first 3D-W array, wherein said second 3D-W array is electrically programmable and can be loaded with a second LUT for a second math function.

6. The configurable gate array according to claim 1, wherein said first 3D-W array is electrically re-programmable and said first configurable computing element can be re-configured to realize different math functions.

7. A configurable gate array, comprising:
    at least a configurable interconnect formed on a semiconductor substrate, wherein said configurable interconnect selectively realizes an interconnect from an interconnect library; and
    at least a configurable computing element, wherein said configurable computing element comprises a first three-dimensional writable memory (3D-W) array stacked above said semiconductor substrate, said first 3D-W array is electrically programmable and can be loaded with a first look-up table (LUT) for a first math function.

8. The configurable gate array according to claim 7, wherein said first 3D-W array at least partially covers said configurable interconnect.

9. The configurable gate array according to claim 7, further comprising at least a configurable logic element.

10. The configurable gate array according to claim 7, wherein said 3D-W array is a horizontal 3D-W array or a vertical 3D-W array.

11. The configurable gate array according to claim 7, further comprising at least a second 3D-W array stacked above said first 3D-W array, wherein said second 3D-W array is electrically programmable and can be loaded with a second LUT for a second math function.

12. The configurable gate array according to claim 7, wherein said first 3D-W array is electrically re-programmable and said first configurable computing element can be re-configured to realize different math functions.

13. A configurable gate array, comprising:
    an array of configurable computing elements including a configurable computing element, wherein said configurable computing element is electrically programmable and can be loaded with a look-up table (LUT) for a math function;
    an array of configurable logic elements including a configurable logic element, wherein said configurable logic element selectively realizes a logic function from a logic library;

an array of configurable interconnects including a configurable interconnect, wherein said array of configurable interconnects couple said array of configurable computing elements with said array of configurable logic elements;

wherein said configurable gate array realizes a math function by programming said array of configurable computing elements, said array of configurable logic elements and said array of configurable interconnects.

14. The configurable gate array according to claim 13, wherein at least a portion of said configurable computing element is formed in a three-dimensional writable memory (3D-W) array stacked above a semiconductor substrate.

15. The configurable gate array according to claim 14, wherein said 3D-W array is a horizontal 3D-W array or a vertical 3D-W array.

16. The configurable gate array according to claim 14, wherein said 3D-W array at least partially covers said configurable logic element or said configurable interconnect.

17. The configurable gate array according to claim 14, wherein said 3D-W array is electrically re-programmable and said configurable computing element can be re-configured to realize different math functions.

18. The configurable gate array according to claim 13, wherein said configurable logic element is formed on said semiconductor substrate.

19. The configurable gate array according to claim 13, wherein said configurable interconnect is formed on said semiconductor substrate.

20. The configurable gate array according to claim 13, further comprising at least one multiplier.

* * * * *